United States Patent
Bagger et al.

(10) Patent No.: US 9,660,583 B2
(45) Date of Patent: May 23, 2017

(54) SIGNAL GENERATOR AND ASSOCIATED PHASE SHIFT APPARATUS AND METHOD

(71) Applicant: TELEFONAKTIEBOLAGET L M ERICSSON (PUBL), Stockholm (SE)

(72) Inventors: Reza Bagger, Järfälla (SE); Stefan Sahl, Solna (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 15/026,472

(22) PCT Filed: Oct. 11, 2013

(86) PCT No.: PCT/SE2013/051195
§ 371 (c)(1),
(2) Date: Mar. 31, 2016

(87) PCT Pub. No.: WO2015/053672
PCT Pub. Date: Apr. 16, 2015

(65) Prior Publication Data
US 2016/0254784 A1    Sep. 1, 2016

(51) Int. Cl.
| H04L 7/00 | (2006.01) |
| H04L 25/00 | (2006.01) |
| H04L 25/40 | (2006.01) |
| H03B 27/00 | (2006.01) |
| H03H 11/22 | (2006.01) |
| H04L 27/22 | (2006.01) |

(52) U.S. Cl.
CPC ............ *H03B 27/00* (2013.01); *H03H 11/22* (2013.01); *H04L 27/22* (2013.01); *H03B 2200/0078* (2013.01)

(58) Field of Classification Search
CPC   H03B 27/00; H03B 2200/0078; H03H 11/22; H03H 19/008; H04L 27/22; H03D 7/14; H03D 7/1433; H03D 7/1441
USPC .................................................... 375/371, 235
See application file for complete search history.

(56) References Cited

U.S. PATENT DOCUMENTS

| 5,926,047 | A | 7/1999 | Harrison | |
| 6,356,131 | B1 * | 3/2002 | Kuwano | H03H 11/22 327/234 |
| 6,628,343 | B1 * | 9/2003 | Kitazono | H04N 5/4446 348/726 |
| 7,519,348 | B2 * | 4/2009 | Shah | H03D 7/14 455/285 |
| 9,191,127 | B2 * | 11/2015 | Koli | H03H 19/008 |
| 2006/0055442 | A1 | 3/2006 | Tanaka et al. | |

(Continued)

*Primary Examiner* — Phuong Phu (57) ABSTRACT

It is presented a signal generator for providing a first signal on a first output and a second signal on a second output wherein the first signal and the second signal are provided with phase shift relative to each other. The signal generator comprises: a control loop controller; a comparator; a phase shifter, the phase shifter being arranged to provide the first signal on the first output and the second signal on the second output; and a phase error detector, the inputs of which are connected to the outputs of the phase shifter and the output of which is connected to an input of the control loop controller. The output of the control loop controller is connected in a feedback loop to a first input of the comparator, and a second input of the comparator is arranged to be connected to an alternating current source.

12 Claims, 6 Drawing Sheets

(56) References Cited

U.S. PATENT DOCUMENTS

| | | | |
|---|---|---|---|
| 2006/0293017 A1* | 12/2006 | Kim | H03D 7/1433 |
| | | | 455/323 |
| 2008/0284487 A1* | 11/2008 | Pullela | H03D 7/1441 |
| | | | 327/355 |
| 2009/0191833 A1* | 7/2009 | Kaczman | H03F 1/301 |
| | | | 455/296 |
| 2010/0090740 A1 | 4/2010 | Teetzel | |

\* cited by examiner

SIGNAL GENERATOR AND ASSOCIATED PHASE SHIFT APPARATUS AND METHOD

This application is a 371 of International Application No. PCT/SE2013/051195, filed Oct. 11, 2013, the disclosure of which is fully incorporated herein by reference.

TECHNICAL FIELD

The invention relates to a signal generator and associated phase shift apparatus and method, for providing a first signal on a first output and a second signal on a second output.

BACKGROUND

In telecommunication networks, homodyne or direct conversion receivers utilise quadrature mixing for digital modulation schemes (phase and frequency modulation). To support such modulation, the RF (radio frequency) signal or local oscillator (LO) signal is phase shifted by 90° degrees. This results in two signals which are orthogonal in relation to each other, denoted an I signal and a Q signal.

Ideally, the I and Q signals should be of equal amplitude and have a phase shift relative each other of 90 degrees. A deviation in amplitude or phase shift from the ideal can corrupt the down converted signal and raise bit error rate.

The LO chain comprising the local oscillator and circuitry to provide two phase shifted square waves is one potential source of phase mismatches. One reason for this is that the LO chain normally involves in signal handling of high frequencies, often double the frequency of the RF signal. Most of the circuit design of LO chain involves some layout or design that partially differs between I and Q branches. The interface to the external LO signal normally involves impedance transformation or unbalanced to balanced conversion that may introduces error in the LO signal chain.

SUMMARY

Any reduction in mismatches in phase differences would be beneficial and would reduce bit error rates when quadrature modulation is employed.

It is an object to provide two signals from an input signal where the accuracy of the phase difference between the two signals is improved.

According to a first aspect, it is presented a signal generator for providing a first signal on a first output and a second signal on a second output wherein the first signal and the second signal are provided with phase shift relative to each other. The signal generator comprises: a control loop controller; a comparator; a phase shifter, an input of which is connected to the output of the comparator, the phase shifter being arranged to provide the first signal on the first output and the second signal on the second output; and a phase error detector, the inputs of which are connected to the outputs of the phase shifter and the output of which is connected to an input of the control loop controller. The output of the control loop controller is connected in a feedback loop to a first input of the comparator, and a second input of the comparator is arranged to be connected to an alternating current source. Through the feedback phase error detector and the feedback loop through the control loop controller, the error between the phases is greatly reduced or even essentially eliminated. Moreover, the feedback loop is capable of compensating for changes over time, such as temperature changes, etc.

The error signal of the phase error detector may be at a minimum when there is a ninety degree phase shift between its inputs. This makes the signal generator reduce any error from the ninety degree phase shift.

The phase error detector may comprise an error mixer, which multiplies the two inputs of the phase error detector, and an error low pass filter connected to the output of the error mixer. This way to detect errors is efficient and does not require many components.

The signal generator may further comprise a differentiator, the inputs of which are the output of the phase error detector and a reference voltage, wherein the output of the differentiator is connected to the input of the control loop controller. In this way, the reference voltage can be used to tune the circuit to a particular phase error.

The control loop controller may comprise a proportional control component.

The control loop controller may comprise an integration control component.

The phase shifter may comprise a first latch and a second latch connected to each other.

According to a second aspect, it is presented a phase shift apparatus comprising: a radio frequency, RF, input; the signal generator according to the first aspect; a first mixer connected to the first output of the signal generator and the RF input; and a second mixer connected to the second output of the signal generator and the RF input.

The phase shift apparatus may further comprise: a first output filter connected to the output of the first mixer and a second output filter connected to the output of the second mixer.

According to a third aspect, it is presented a receiver comprising the phase shift apparatus according to the second aspect.

According to a fourth aspect it is presented a radio base station comprising the receiver according to the third aspect.

According to a fifth aspect, it is presented a method for providing a first signal on a first output and a second signal on a second output using a signal generator comprising: a control loop controller; a comparator; a phase shifter, an input of which is connected to the output of the comparator, the phase shifter providing the first signal on the first output and the second signal on the second output; and a phase error detector, the inputs of which are connected to the outputs of the phase shifter and the output of which is connected to an input of the control loop controller; wherein the output of the control loop controller is connected in a feedback loop to a first input of the comparator, and a second input of the comparator is arranged to be connected to an alternating current source. The method is performed in the signal generator and comprises the step of: generating the first signal and the second signal with phase shift relative to each other.

It is to be noted that any feature of any of the first, second, third, fourth and fifth aspect may, where appropriate, be applied to any other of these aspects.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figure 1A:
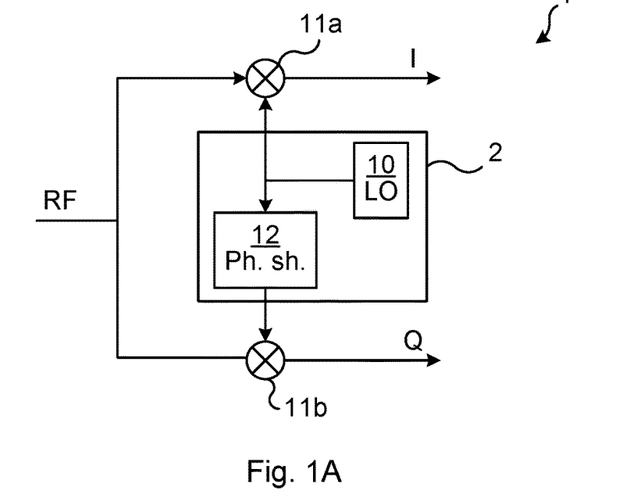
FIGS. 1A-B are schematic diagrams of a phase shift apparatus according to embodiments for two and four phases, respectively.

FIG. 1A is a schematic diagram of a phase shift apparatus according to one embodiment where two phases are used. An RF signal is provided to a first mixer 11a and a second mixer 11b. A signal generator 2 generates two signals, respectively provided to the first mixer 11a and the second mixer 11b. There is a phase difference between the two signals of 90 degrees, while the waveform and amplitude of the signals are the same. The waveform can e.g. be a square wave. The derivative of the wave when it passes zero (i.e. during zero crossing) should be large in order to prevent overlap between different phases.

While the actual implementation may differ, the embodiment of FIG. 1A illustrates what is accomplished by the signal generator 2.

In this embodiment, the signal generator 2 comprises a local oscillator 10 and a quarter wave phase shifter 12. The quarter wave phase shifter 12 shifts the signal from the local oscillator 90 degrees and provides its output to the second mixer 11b. The local oscillator signal is provided to the first mixer 11a without passing through the quarter wave phase shifter 12. In this way, the first mixer 11a and the second mixer 11b provide sections of the RF signal, phase shifted with 90 degrees. The output of the first mixer 11a is denoted an I signal and the output of the second mixer 11b is denoted a Q signal. The Q and I signals can be used for demodulation of the RF signal. The embodiment of FIG. 1A thus involves a 50% duty cycle.

However, as explained above, any deviation from a 90 degree phase shift can e.g. result in increased bit error rates. Phase errors can result from any part of FIG. 1A, e.g. by different connector lengths for any Q or I connector, inaccurate voltage references (see FIG. 2 below), etc.

Figure 1B:
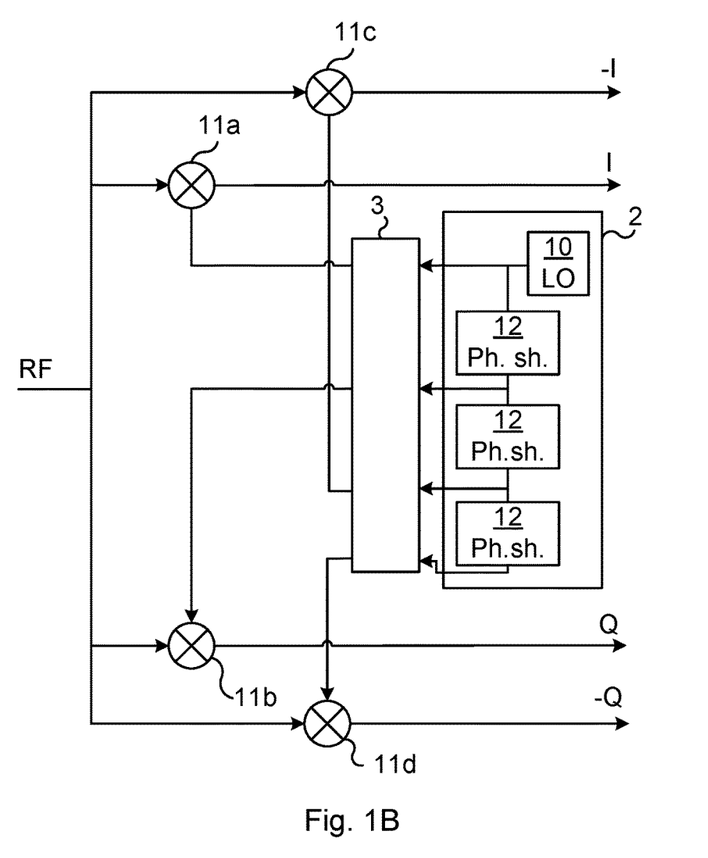
Figure 2:
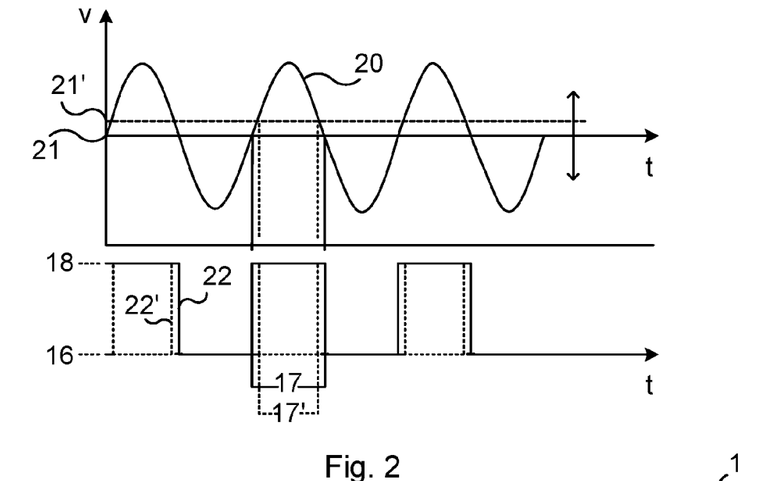
FIG. 2 is a schematic graph illustrating the effect of an incorrect reference voltage on timings in the phase shift apparatus of FIG. 1A and/or FIG. 1B.

FIG. 1B is a schematic diagram of a phase shift apparatus according to an embodiment where four phases are used. The RF signal is here also provided to a third mixer 11c and a fourth mixer 11d. The signal generator 2 here generates four signals (see output signals 41-44 of FIG. 5B). These signals are passed through a logical gating device 3 to provide four instances of four phase signals (four phase signals 51-54 of FIG. 5B), respectively provided to the first mixer 11a, the second mixer 11b, the third mixer 11c and the fourth mixer. The embodiment of FIG. 1B thus involves a 25% duty cycle, where apart from the I signal and Q signal, there is also a −I signal and a −Q signal from the third mixer 11c and the fourth mixer 11d, respectively. FIG. 2 is a schematic graph illustrating the effect of an incorrect reference voltage on timings in the phase shift apparatus of FIG. 1A and/or FIG. 1B. A reference signal 21 is provided to one input in a comparator and an alternating current, AC, signal 20 is provided to the other input of the comparator. When the AC signal 20 is greater than the reference signal 21, the comparator provides a high value 18 being a saturated positive signal and when the AC signal 20 is less than the reference signal 21, the comparator provides a low value 16 being a saturated negative or zero signal. In this way, a square wave 22 is generated. The high value section of the square wave 22 has a high value duration 17. When the reference signal 21 is balanced at the centre of the AC signal 20, the high value duration 17 is exactly half of the period length.

If, however, the reference signal drifts, e.g. to a drifted reference signal 21', the resulting square wave 22' is distorted. In this example, when the drifted reference signal 21' drifts to a higher voltage level, the duration 17' of the positive section is reduced, while the period length is unchanged, resulting in an unbalanced square wave.

Hence, it can be seen how any unbalance in reference levels can have great effect in timings etc.

The same mechanism as described above is the source of asymmetrical pulse generation when a differential signal is applied to inputs of comparators.

Figure 3A:
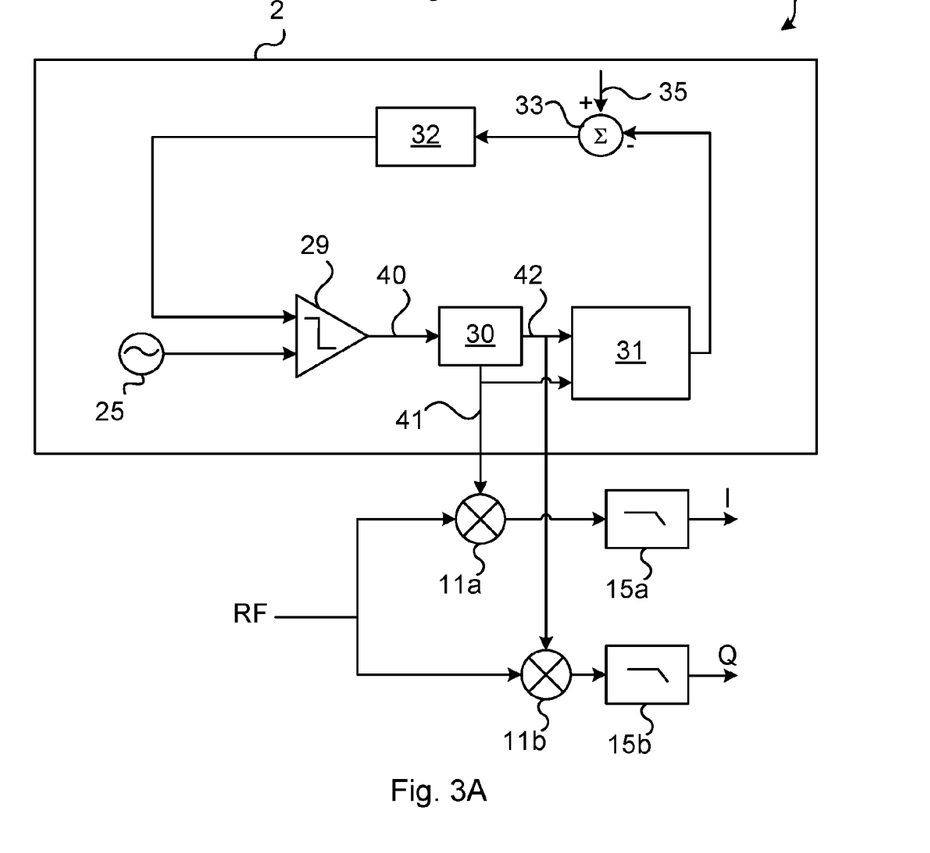
FIG. 3A-B are a schematic diagrams illustrating components of a phase shift apparatus according to embodiments for two and four phases, respectively.

FIG. 3A is a schematic diagram illustrating components of a phase shift apparatus 1 according to one embodiment where two phases are used. The phase shift apparatus 1 comprises a signal generator 2, a first mixer 11a and a second mixer 11b. In this way, as for FIG. 1A, the RF signal is mixed with a first signal 41 in the first mixer 11a to generate the I signal. Analogously, the RF signal is mixed with a second signal 42 in the second mixer 11b to generate the Q signal. The first signal 41 and the second signal 42 are provided with essentially equal amplitude and frequency but with a phase shift relative to each other of 90 degrees. Mixing of signals is here to be interpreted as multiplying of signals.

Optionally, there is a first output filter 15a connected to the output of the first mixer 11a and a second output filter 15b connected to the output of the second mixer 11b. The output filters 15a-b can be tuned to filter out any higher frequency components resulting from the mixing in the mixers 15a-b.

The signal generator 2 comprises a control loop controller 32, a comparator 29, a phase shifter 30, and a phase error detector 31.

An input 40 of the phase shifter 30 is connected to the output of the comparator 29. The phase shifter is arranged to provide the first signal on the first output 41 and the second signal on the second output 42.

The inputs of the phase error detector 31 are connected to the outputs 41, 42 of the phase shifter 30 to detect any error compared to a desired phase shift between the signals on the outputs 41, 42 of the phase shifter 30. The error signal, being the output signal of the phase error detector 31, can for instance be at a minimum when there is a 90 degree phase shift between its inputs.

The output of the phase error detector is connected to an input of the control loop controller 32, optionally via a differentiator 33 to apply an external reference voltage.

The output of the control loop controller 32, in turn, is connected in a feedback loop to a first input of the comparator 29. The second input of the comparator 29 is connected to an alternating signal source 25. The alternating signal source 25 can be internal or external to the signal generator 2. The comparator 29 generates a square wave as explained with reference to FIG. 2 above.

Using this feedback loop, any error in the phase shift is detected by the phase error detector 31, which is then fed back to the control loop controller 32 which in turn regulates the feedback by providing a controlled reference signal input to the comparator 29. In this way, the error in the phase shift between the signals on the first output 41 and the second output 42 is minimised. The source of the phase shift error is not important, since any phase shift error will be picked up by the phase error detector 31. In other words, the phase shift error can originate from an inaccurate AC source, non-ideal components, temperature variations or phase/frequency modulation resulting of signal leakage from different parts of the circuit.

The control loop controller 32 can be any suitable controller for feedback loop control. For example, the control loop controller can be a P (proportional) controller, PI (proportional integral) controller which reduces any steady disturbances or a PID (proportional integral derivative) controller which are commonly available. It is to be noted that a PID controller can be configured to operate as a P controller or a PI controller.

The optional differentiator 33 can be provided between the phase error detector 31 and the control loop controller 32. The differentiator outputs a difference between a reference voltage 35 and the output of the phase error detector 31. The reference voltage 35 can in this way be used to semi-statically tune the signal generator 2.

Figure 3B:
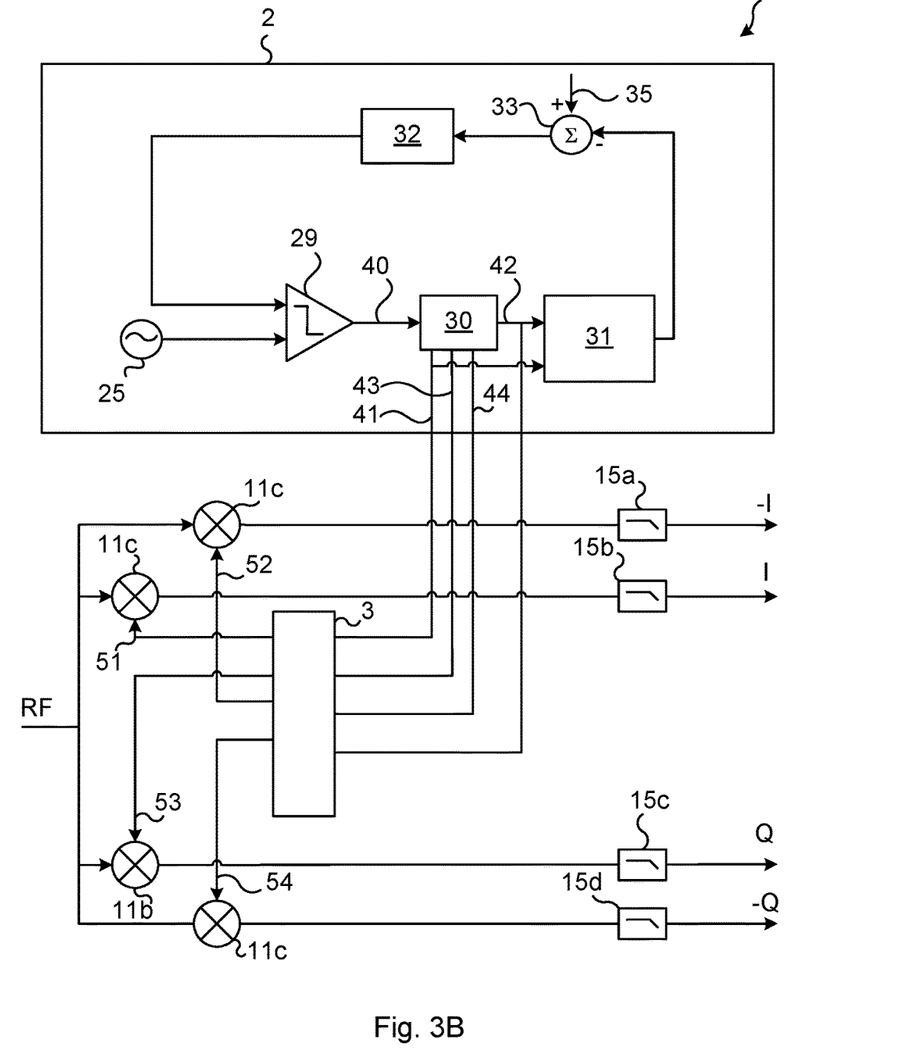

FIG. 3B is a schematic diagram illustrating components of a phase shift apparatus 1 according to one embodiment where four phases are used. Here, the phase shifter 30 has four outputs 41-44. All outputs are provided to the logical gating device 3 which operates as described above with reference to FIG. 1B. In this way, using the four mixers 11*a*-*d*, four mixed signals I, −I, Q and −Q are provided for demodulation of the RF signal, e.g. using QPSK (Quadrature Phase Shift Keying).

The phase error detector 31 is here configured to detect phase errors between the first output 41 and the second output 42, as explained above for the embodiment of FIG. 3A. However, the phase error detector could equally well find errors between any other two outputs where the phase difference is intended to be 90 degrees.

Figure 4:
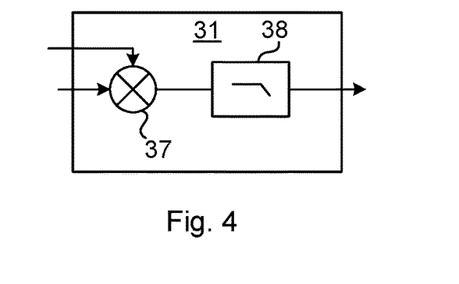
FIG. 4 is a schematic diagram illustrating an embodiment of the phase error detector of FIG. 3A and/or FIG. 3B.

FIG. 4 is a schematic diagram illustrating an embodiment of the phase error detector 31 of FIG. 3A and/or FIG. 3B. The phase error detector 31 comprises an error mixer 37, which multiplies the two inputs of the phase error detector 31. The output of the error mixer 37 is fed to an error low pass filter 38. The output of the error low pass filter 38 is the output of the phase error detector 31.

Since the frequency of the two inputs is the same, the error mixer 37 functions as an error detector, where the baseband voltage generated is a DC (direct current) level which increases with increased the phase deviation from 90 degrees. The phase deviation from 90 degrees by the inputs to the error mixer 37 when detecting the error signal can be expressed in (1):

$$\cos(\omega t)\sin(\omega t + \varepsilon) = \frac{1}{2}[\sin(2\omega t + \varepsilon) + \sin(\varepsilon)] \quad (1)$$

where $\varepsilon$ is the error quantity, indicating a deviation from 90 degree phase shift. Looking at the expression on the right, the frequency dependent term is filtered out using the error low pass filter 38. Hence, the output of the error detector can be expressed as the frequency independent expression $$\frac{1}{2}[\sin(\varepsilon)].$$

When the signal inputs are not pure sinusoidal, Fourier overtones of the inputs will result in frequency dependent terms after the mixing, but these will all be filtered out by the error low pass filter 38. Still however, formula (1) holds true for the first order Fourier component, corresponding to the fundamental frequency of the input signals.

Figure 5A:
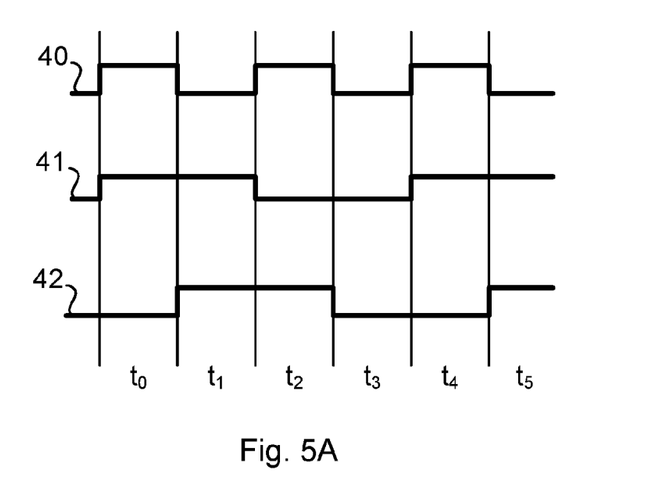
FIGS. 5A-B are schematic graphs illustrating signals of the phase shifters of FIGS. 3A and 3B, respectively.

FIG. 5A is a schematic graph illustrating signals of the phase shifter of FIG. 3A over time segments $t_0$ to $t_5$ for a situation where two phases are used. At the top section, the signal on the input 40 is shown. In the middle section, the signal on the first output 41 is shown and in the lower section, the signal on the second output is shown. The signal on the input 40 is of double frequency compared to the signals on the two outputs 41, 42. Also note that the frequency of the signals of the two outputs 41, 42 is the same, but that there is a 90 degree phase shift between the two signals of the two outputs 41, 42. It is to be noted that 90 degrees is the same as a quarter of a period length.

Figure 5B:
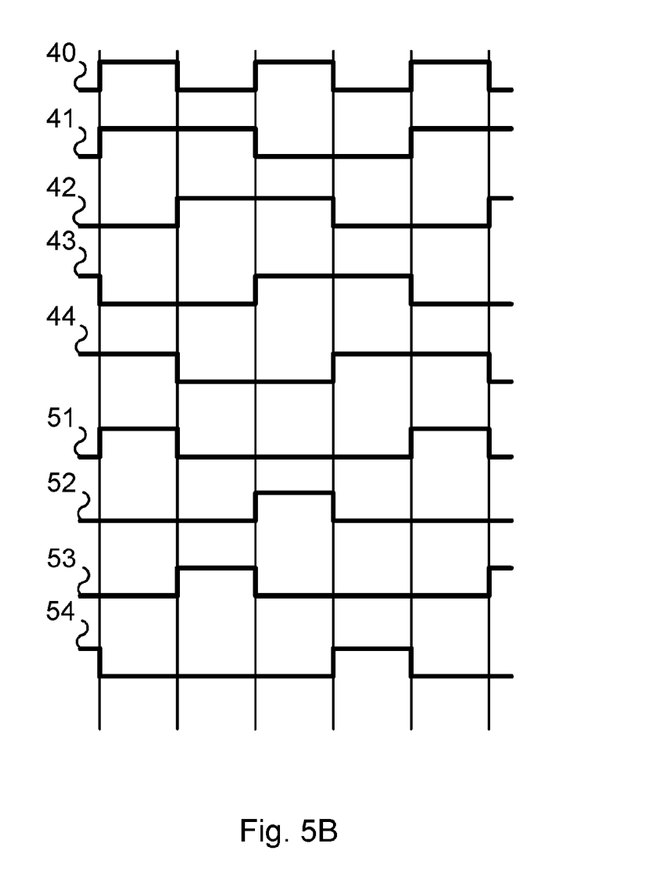

FIG. 5B is a schematic graph illustrating signals of the phase shifter of FIG. 3B over time segments $t_0$ to $t_5$ for a situation where two phases are used, such as in FIG. 3A A first four phase signal 51 is generated by performing a logical AND operation between the first output 41 and the fourth output 44. A second four phase signal 52 is generated by performing a logical AND operation between the second output 42 and the third output 43. A third four phase signal 53 is generated by performing a logical AND operation between the first output 41 and the second output 42. A fourth four phase signal 51 is generated by performing a logical AND operation between the first output 41 and the fourth output 44.

Figure 6:
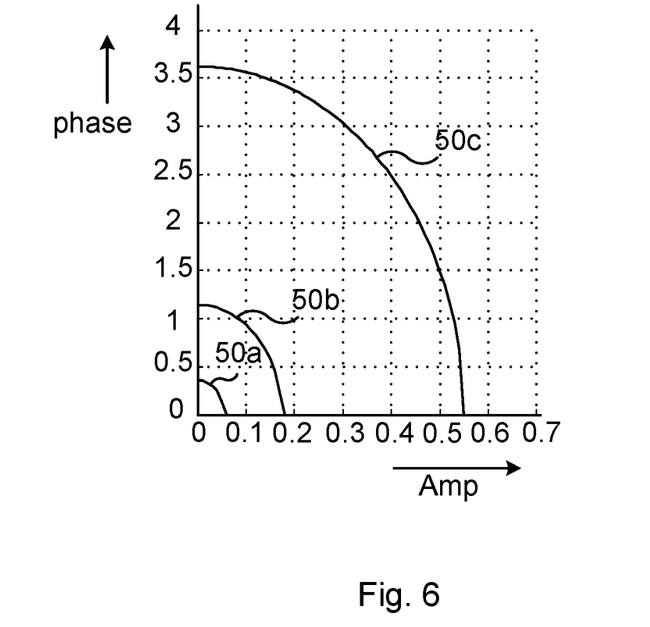
FIG. 6 is a schematic graph illustrating image rejection ratio dependent on a mismatch between I and Q branches.

FIG. 6 is a schematic graph illustrating image rejection ratio dependent on a mismatch between I and Q branches. Image Rejection Ratio, IMRR as parameter of phase and amplitude errors. There are here three illustrative curves: one 50 dB curve 50*a*, one 40 dB curve 50*b* and one 30 dB curve 50*c*. For instance, for 40 dB rejection, maximum phase error of about 1.1 degrees and maximum amplitude error of about 0.18 dB are tolerated.

Figure 7:
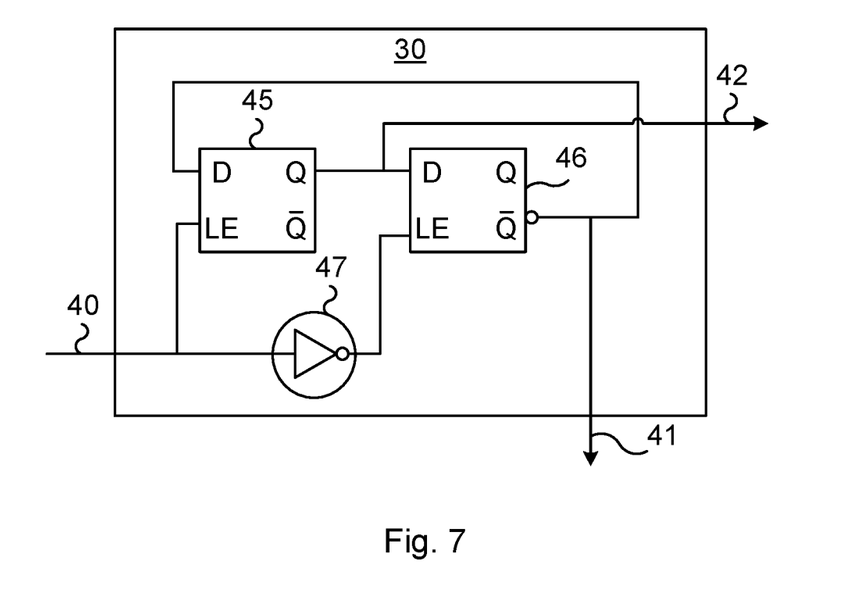
FIG. 7 is a schematic diagram illustrating an embodiment of the phase shifter 30 of FIG. 3A.

FIG. 7 is a schematic diagram illustrating an embodiment of the phase shifter 30 of FIG. 3A. When supplied with the input 40 shown in FIG. 5A, the outputs 41, 42 of FIG. 5A are generated. Similar principles can be expanded to create a phase shifter which provides four phases such as for FIG. 3B.

The phase shifter 30 comprises a first latch 45 and a second latch 46. The latches can be of any suitable type, but in this example both latches are gated D latches. Each latch 45, 46 has a data input D and a latch enable port LE. Furthermore, each latch provides an output Q (not to be confused with the Q signal of FIGS. 1 and 3) and an inverted output $\overline{Q}$.

The truth table for the gated D latch is as follows:

TABLE 1 truth table for a gated D latch

| LE | D | Q | $\overline{Q}$ | Comment |
|---|---|---|---|---|
| 0 | Does not matter | Previous value | Previous value | No change on output |
| 1 | 0 | 0 | 1 | Reset |
| 1 | 1 | 1 | 0 | Set |

The input 40 is connected to the LE port of the first latch 45 and is passed through a inverter 47 before being passed to the LE port of the second latch 46.

Looking now to how the phase shifter operates over time, Table 2 below describes a sequence in accordance with the input signal 40 of FIG. 5A, passing through the time segments $t_0$ to $t_5$.

The columns of Table 2 are evaluated as follows: $1^{st}$ LE is the LE port of the first latch 45 and is equal to the input 40. The $1^{st}$ D is the D port of the first latch 45 and is equal to the $2^{nd}$ $\overline{Q}$. $1^{st}$ Q is the Q output of the first latch 45 and is evaluated according to Table 1. $2^{nd}$ D is the D port of the second latch 46 and is equal to $2^{nd}$ Q. $2^{nd}$ LE is the LE port of the second latch 46 and is the inversion of the input 40. $2^{nd}$ Q is the Q output of the second latch 46 and is evaluated according to Table 1. $2^{nd}$ $\overline{Q}$ is the $\overline{Q}$ output of the second latch 46 and is also evaluated according to Table 1. The first output 41 is taken as $2^{nd}$ $\overline{Q}$ and the second output 42 is taken as the $1^{st}$ Q.

Using this evaluation, Table 2 is populated as follows:

TABLE 2 operation of the latches of the phase shifter over time

| Time seg-ment | Input 40 | $1^{st}$ LE | $1^{st}$ D | $1^{st}$ Q | $2^{nd}$ D | $2^{nd}$ LE | $2^{nd}$ Q | $2^{nd}$ $\overline{Q}$ | First output 41 | Second output 42 |
|---|---|---|---|---|---|---|---|---|---|---|
| t0 | 0 | 0 | 0 | 0 | 0 | 1 | 0 | 1 | 1 | 0 |
| t1 | 1 | 1 | 1 | 1 | 1 | 0 | 0 | 1 | 1 | 1 |
| t2 | 0 | 0 | 1 | 1 | 1 | 1 | 1 | 0 | 0 | 1 |
| t3 | 1 | 1 | 0 | 0 | 0 | 0 | 1 | 0 | 0 | 0 |
| t4 | 0 | 0 | 0 | 0 | 0 | 1 | 0 | 1 | 1 | 0 |
| t5 | 1 | 1 | 1 | 1 | 1 | 0 | 0 | 1 | 1 | 1 |
| ... | | | | | | | | | | |

As can be seen from Table 2, the structure of the phase shifter provides the output signals 41, 42 in accordance with FIG. 5A.

Figure 8:
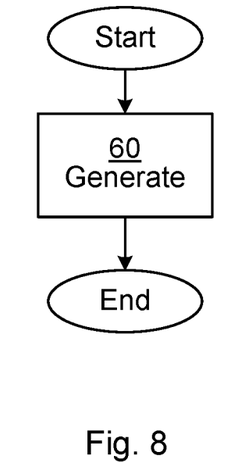
FIG. 8 is a flow chart illustrating a method performed in the signal generator of FIG. 3.

FIG. 8 is a flow chart illustrating a method performed in the signal generator of FIG. 3A and/or FIG. 3B. The method operates in accordance with what is described above and comprises one step.

In a generate step 60, the first signal 41 and the second signal 42 are generated with phase shift relative to each other. The phase shift can e.g. be 90 degrees.

Figure 9:
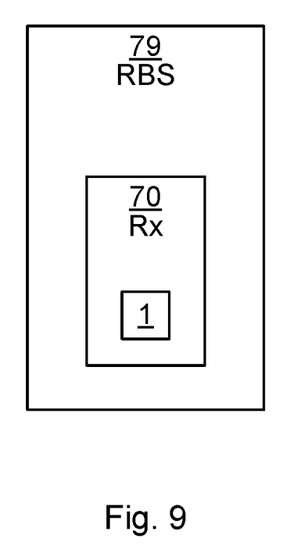
FIG. 9 is a schematic diagram illustrating a radio base station comprising the phase shift apparatus of FIG. 3A or 3B.

FIG. 9 is a schematic diagram illustrating a radio base station comprising the phase shift apparatus of FIG. 3A or 3B. A radio base station 75 comprises a receiver 70 for receiving radio signals from wireless devices such as User Equipment (UE). The receiver 70 comprises the phase shift apparatus 1 of FIGS. 3A and/or 3B.

It is to be noted that the embodiments presented herein can equally well be applied in as scenario where differential input is used.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A signal generator for providing a first signal on a first output and a second signal on a second output wherein the first signal and the second signal are provided with a phase shift relative to each other, the signal generator comprising:
   a control loop controller;
   a comparator;
   a phase shifter, an input of which is connected to the output of the comparator, the phase shifter being arranged to provide the first signal on the first output and the second signal on the second output; and
   a phase error detector, the inputs of which are connected to the outputs of the phase shifter and the output of which is connected to an input of the control loop controller;
   wherein the output of the control loop controller is connected in a feedback loop to a first input of the comparator, and a second input of the comparator is arranged to be connected to an alternating current source.

2. The signal generator according to claim 1, wherein the error signal of the phase error detector is at a minimum when there is a ninety degree phase shift between its inputs.

3. The signal generator according to claim 1, wherein the phase error detector comprises an error mixer, which multiplies the two inputs of the phase error detector, and an error low pass filter connected to the output of the error mixer.

4. The signal generator according to claim 1, further comprising a differentiator, the inputs of which are the output of the phase error detector and a reference voltage, wherein the output of the differentiator is connected to the input of the control loop controller.

5. The signal generator according to claim 1, wherein the control loop controller comprises a proportional control component.

6. The signal generator according to claim 1, wherein the control loop controller comprises an integration control component.

7. The signal generator according to claim 1, wherein the phase shifter comprises a first latch and a second latch (46) connected to each other.

8. A phase shift apparatus comprising the signal generator of claim 1 and further comprising:
   a radio frequency, RF, input;
   a first mixer connected to the first output of the signal generator and the RF input; and
   a second mixer connected to the second output of the signal generator and the RF input.

9. The phase shift apparatus according to claim 8, further comprising:
   a first output filter connected to the output of the first mixer and a second output filter connected to the output of the second mixer.

10. A receiver comprising the phase shift apparatus according to claim 8.

11. A radio base station comprising the receiver according to claim 10.

12. A method for providing a first signal on a first output and a second signal on a second output using a signal generator that comprises a control loop controller; a comparator; a phase shifter, and a phase error detector, the method being performed in the signal generator and comprising:
- comparing, by the comparator, a signal from an alternating current source with a controlled reference signal from the control loop controller;
- generating, by the phase shifter, the first signal and the second signal with a phase shift relative to each other;
- detecting, at the phase error detector, a phase error between the phase shift of the first and second signals relative to each other and a desired phase shift; and
- generating, by the control loop controller connected in a feedback loop to an input of the comparator, the controlled reference signal based on the phase error.

* * * * *